US008709867B2

(12) United States Patent
Liu et al.

(10) Patent No.: US 8,709,867 B2
(45) Date of Patent: Apr. 29, 2014

(54) DUAL-LEADFRAME MULTI-CHIP PACKAGE AND METHOD OF MANUFACTURE

(75) Inventors: Kai Liu, Mountain View, CA (US); Lei Shi, Shanghai (CN); Jun Lu, San Jose, CA (US); Anup Bhalla, Santa Clara, CA (US)

(73) Assignee: Alpha & Omega Semiconductor Inc., Sunnyvale, CA (US)

( * ) Notice: Subject to any disclaimer, the term of this patent is extended or adjusted under 35 U.S.C. 154(b) by 0 days.

(21) Appl. No.: 13/411,990

(22) Filed: Mar. 5, 2012

(65) Prior Publication Data

US 2012/0161304 A1 Jun. 28, 2012

Related U.S. Application Data (62) Division of application No. 12/749,505, filed on Mar. 29, 2010, now Pat. No. 8,154,108.

(51) Int. Cl.
*H01L 21/00* (2006.01)

(52) U.S. Cl.
USPC .......................... 438/107; 438/108; 438/123

(58) Field of Classification Search
None
See application file for complete search history.

(56) References Cited

U.S. PATENT DOCUMENTS

| 6,465,875 | B2 * | 10/2002 | Connah et al. ............... 257/666 |
| 6,919,644 | B2 * | 7/2005 | Uchida ........................ 257/784 |
| 7,622,796 | B2 * | 11/2009 | Shi et al. ...................... 257/678 |
| 7,776,658 | B2 * | 8/2010 | Liu et al. ...................... 438/121 |
| 8,138,585 | B2 * | 3/2012 | Liu et al. ...................... 257/675 |
| 2008/0087992 | A1 * | 4/2008 | Shi et al. ...................... 257/670 |
| 2009/0179315 | A1 * | 7/2009 | Jereza ........................... 257/676 |
| 2009/0189259 | A1 * | 7/2009 | Mohamed et al. ............ 257/666 |
| 2009/0294936 | A1 * | 12/2009 | Liu et al. ...................... 257/675 |
| 2010/0032819 | A1 * | 2/2010 | Liu et al. ...................... 257/676 |
| 2010/0133674 | A1 * | 6/2010 | Hebert et al. ................. 257/686 |
| 2011/0095409 | A1 * | 4/2011 | Xue et al. ..................... 257/676 |
| 2011/0095410 | A1 * | 4/2011 | Gomez ......................... 257/676 |
| 2011/0221008 | A1 * | 9/2011 | Lu et al. ........................ 257/391 |
| 2012/0161304 | A1 * | 6/2012 | Liu et al. ...................... 257/676 |

* cited by examiner

*Primary Examiner* — David E Graybill (74) *Attorney, Agent, or Firm* — Chein-Hwa Tsao; CHEmily LLC (57) ABSTRACT

A dual-leadframe multi-chip package comprises a first leadframe with a first die pad, and a second leadframe with a second die pad; a first chip mounted on the first die pad functioning as a high-side MOSFET and second chip mounted on the second die pad functioning as a low-side MOSFET. The package may further comprises a bypass capacity configured as a third chip mounted on the first die pad or integrated with the first chip. The package may further comprise a three-dimensional connecting plate formed as an integrated structure as the second die pad for electrically connecting a top contact area of the first chip to a bottom contact area of the second chip. A top connecting plate connects a top contact area of the second chip and a top contact area of the third chip to an outer pin of the first leadframe.

9 Claims, 7 Drawing Sheets

DUAL-LEADFRAME MULTI-CHIP PACKAGE AND METHOD OF MANUFACTURE

CROSS REFERENCE TO RELATED APPLICATIONS

This application is a divisional application of a U.S. patent application entitled "Dual-leadframe Multi-chip Package and Method of Manufacture" by Kai Liu et al with filing date of Mar. 29, 2010 and application Ser. No. 12/749,505 now U.S. Pat. No. 8,154,108 whose content is hereby incorporated by reference for all purposes.

FIELD OF THE INVENTION

This invention relates to a semiconductor packaging structure and its manufacturing method, and more specifically to a dual-leadframe multi-chip package and its manufacturing method.

BACKGROUND OF THE INVENTION

A power metal-oxide-semiconductor field effect transistor (MOSFET) device, featuring high integration density, high reliability, extremely low static current leakage and improving power handling capacity, is widely applied in consumer electronics, computers and other related sectors.

Figure 1:
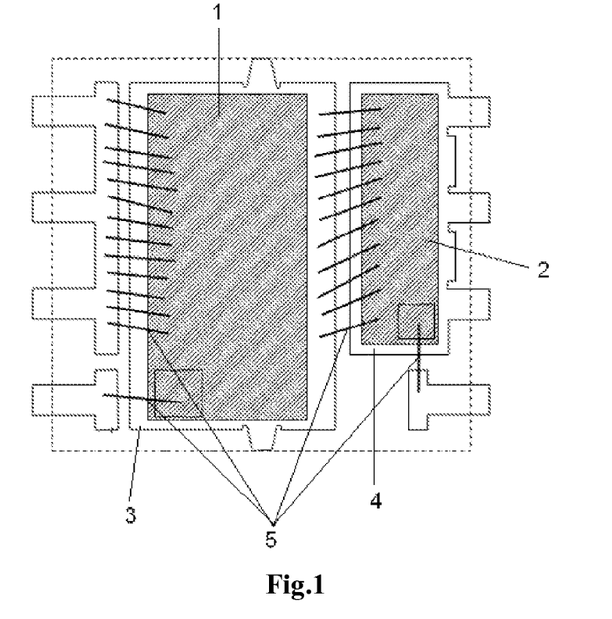
FIG. 1 is the schematic view of the packaging structure of HS MOSFET and LS MOSET in the existing art.

In the existing art, as shown in FIG. 1, when co-packaging a high-side metal-oxide-semiconductor field effect transistor (HS MOSFET) 2 and a low-side metal-oxide-semiconductor field effect transistor (LS MOSFET) 1, the HS MOSFET 2 and LS MOSFET 1 are installed on die pad 4 and die pad 3 of a leadframe respectively, and the connections from the top electrodes of LS MOSFET 1 and HS MOSFET 2 to the pins of the die pad, as well as the connection between the top source contact area of the HS MOSFET 2 and the bottom drain contact area of LS MOSFET 1 are realized through bond wires 5.

Figure 2:
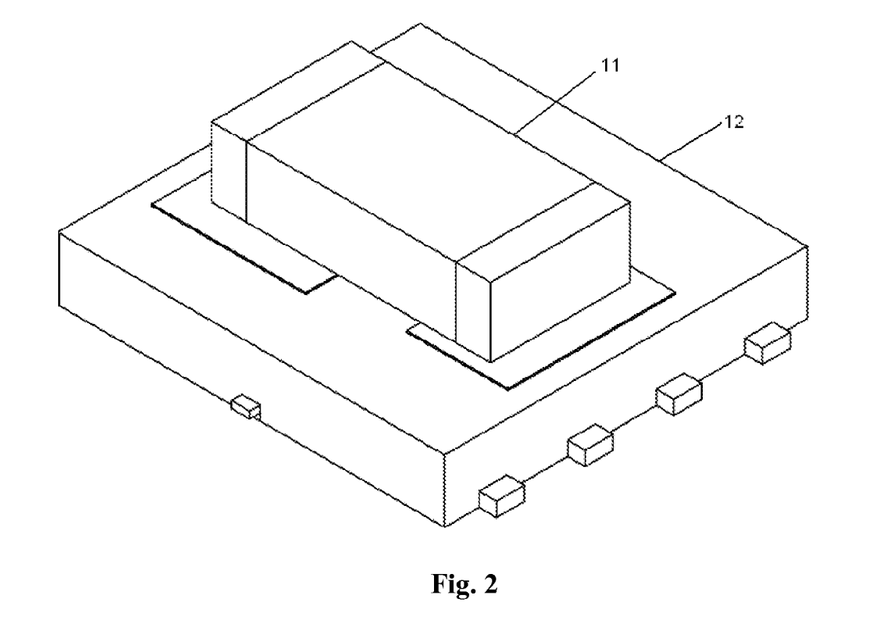
FIG. 2 is the schematic view of the structure with capacitor mounted on the semiconductor package surface in the existing art.

In the existing art, as shown in FIG. 2, a surface mounted capacitor 11 may be configured on the surface of the semiconductor package 12 to decrease parasitic inductance.

In the package of the abovementioned device, with the chips connected by bond wires, the resistance and inductance between the chips are increased; and with the capacitor mounted on semiconductor surface, the size and cost of the semiconductor package are also increased.

SUMMARY OF THE INVENTION

The present invention aims at providing a dual-leadframe multi-chip package and its manufacturing method, wherein its packaging structure realizes a connection between chips and between leadframes through connecting plates, thus to decrease the resistance and inductance between the chips, integrate a bypass capacitor in package, reduce the parasitic inductance during packaging, improve the energy conversion efficiency of the whole device and reduce the sizes of semiconductor package. The present invention also boasts a simple process, easy operation and low manufacturing cost.

To achieve the above purpose, the present invention adopts the following technical solution: a dual-leadframe multi-chip package, characterized in that, comprising:

Two leadframes, namely a first leadframe and a second leadframe, wherein the first leadframe comprises a die pad and multiple outer pins, the second leadframe comprises a second die padtie bar;

Multiple chips, each having a plurality of top contact areas and a bottom contact area; wherein the multiple chips comprise a first chip and a second chip; the first chip is mounted on the first die pad, the second chip is mounted on the second die pad; the bottom contact area of the first chip is connected with the first die pad, the bottom contact area of the second chip is connected with second die pad;

a plurality of connecting plates, used for the connection in multi-chip package, which comprise a three-dimensional connecting plate and a top connecting plate, wherein the three-dimensional connecting plate and the second die pad form an integrated body, or the three-dimensional connecting plate is electrically connected with the second die pad, and the three-dimensional connecting plate connects a top contact area of the first chip so that the first chip is electrically connected with the second die pad, thus the first chip is electrically connected with the second chip; the top connecting plate connects a top contact area of the second chip and an outer pin of the first leadframe.

The abovementioned dual-leadframe multi-chip package, characterized in that, the first chip is a high-side metal-oxide-semiconductor field effect transistor, and the second chip is a low-side metal-oxide-semiconductor field effect transistor.

A dual-leadframe multi-chip package, characterized in that, comprising:

Two leadframes, namely a first leadframe and a second leadframe respectively, wherein the first leadframe comprises a first die pad and multiple outer pins, the second leadframe comprises a second die padtie bar;

Multiple chips, each having a top contact area and a bottom contact area respectively; wherein the multiple chips further comprise a first chip, a second chip and a third chip; the first chip and the third chip are mounted on the first die pad, the second chip is mounted on the second die pad, the bottom contact areas of the third chip and the first chip are electrically connected with the first die pad respectively, the bottom contact area of the second chip is electrically connected with the second die pad, the first chip and the second chip each further comprises a top gate contact area respectively, the gate contact areas of the first chip and the second chip are connected with the outer pins of the first leadframe respectively and are different from the top contact areas;

A top connecting plate, used for the connection in multi-chip package, wherein the top connecting plate connects the top contact area of the second chip and an outer pin of the first leadframe, and connects the top contact area of the third chip at the same time;

The top contact area of the first chip is electrically connected with the second die pad.

The said dual-leadframe multi-chip package, characterized in that, further comprising a three-dimensional connecting plate, wherein the three-dimensional connecting plate and the second die pad form an integrated body, or the three-dimensional connecting plate is electrically connected with the second die pad, and the three-dimensional connecting plate connects the top contact area of the first chip so that the top contact area of the first chip is electrically connected with the second die pad.

The said dual-leadframe multi-chip package, characterized in that, the top contact area of the first chip is connected with the second die pad through bond wires.

The said dual-leadframe multi-chip package, characterized in that, the first chip and the third chip are integrated to form a chip mounted on the first die pad.

The said dual-leadframe multi-chip package, characterized in that, the first chip is a high-side metal-oxide-semiconductor field effect transistor, the second chip is a low-side metal-oxide-semiconductor field effect transistor and the third chip is bypass capacitor.

The said dual-leadframe multi-chip package, characterized in that, the connecting plate further comprises multiple holes, wherein the holes are used for adsorbing bonding materials so that the connecting plate is stably connected with the top contact area of the chip.

The said dual-leadframe multi-chip package, characterized in that, the gate contact areas of the first chip and the second chip are connected with the outer pins of the first leadframe respectively.

A method for manufacturing dual-leadframe multi-chip package, characterized in that, including the following steps:

Step 1: provide a first leadframe, wherein the first leadframe comprises a first die pad and multiple outer pins;

Step 2: provide multiple chips, comprising a first chip and a second chip, wherein the first chip and the second chip each comprise a bottom contact area and a plurality of top contact areas respectively;

Step 3: the first chip is mounted on the first die pad, the bottom contact area of the first chip is electrically connected with the first die pad through bonding materials, preferably, through conductive adhesive or soldering paste as bonding materials.

Step 4: provide a second leadframe and a three-dimensional connecting plate, wherein the second leadframe comprises a second die padtie bar, the second die pad and the three-dimensional connecting plate form an integrated body, or the three-dimensional connecting plate is electrically connected with the second die pad, and the three-dimensional connecting plate connects a top contact area of the first chip;

Step 5: the second chip is mounted on the second die pad, and the bottom contact area of the second chip is electrically connected with the second die pad.

Step 6: provide a top connecting plate, wherein the top connecting plate connects a top contact area of the second chip and an outer pin of the first leadframe.

A method for manufacturing the dual-leadframe multi-chip package, characterized in that, comprising the following steps:

Step 1: provide a first leadframe, wherein the first leadframe comprises a first die pad and multiple outer pins;

Step 2: provide multiple chips, comprising a first chip, a second chip and a third chip, wherein the first chip and the third chip are mounted on the first die pad, the multiple chips comprises the bottom contact area and the top contact respectively, the bottom contact areas of the third chip and the first chip are electrically connected with the first die pad;

Step 3: provide a second leadframe, wherein the second leadframe comprises a second die padtie bar, the top contact area of the first chip connects the second die pad;

Step 4: the second chip is mounted on the second die pad, and the second chip is electrically connected with the second die pad;

Step 5: provide a top connecting plate, connect the top connecting plate to the top contact area of the second chip and an outer pin of the first leadframe, and the top connecting plate connects the top contact area of the third chip as well;

Step 6: the top contact areas of the first chip and the second chip each further comprise a top gate contact area different from the top contact area, wherein the gate contact areas of the first chip and the second chip are each connected with an outer pin of the first leadframe respectively;

Step 7: clean leadframes, adopt plastic package to enclose the die pads, connecting plates and chips, only part of outer pins of the leadframes are exposed, and the pins are electroplated.

A method for manufacturing dual-leadframe multi-chip package, characterized in that, in step 3, further comprising a three-dimensional connecting plate, preferably, the three-dimensional connecting plate and the second die pad form an integrated structure, or the three-dimensional connecting plate is electrically connected with the second die pad, and the three-dimensional connecting plate connects the top contact area of the first chip, so that the top contact area of the first chip is electrically connected with the second die pad.

The method for manufacturing the dual-leadframe multi-chip package, characterized in that, in step 3, further comprising multiple bond wires, wherein the top contact area of the chip is connected with the second die pad through the bond wires.

The method for manufacturing the dual-leadframe multi-chip package, characterized in that, in step 2, the first chip and the third chip are integrated into an integrated chip first, and then the integrated chip is mounted on the first die pad.

The method for manufacturing the dual-leadframe multi-chip package, characterized in that, in Step 6, further comprising the following steps:
 a) A solder bump is formed on each of the gates of the first and second chips;
 b) The gate contact areas on the first chip and the second chip are respectively connected with the outer pins of the first leadframe;

The method for manufacturing the said dual-leadframe multi-chip package, characterized in that, the chips are mounted on the die pads through bonding materials, and the connecting plates are connected with the top contact areas of the chips through the bonding materials.

The method for manufacturing the said dual-leadframe multi-chip package, characterized in that, multiple holes are set on the three-dimensional connecting plate and top connecting plate, so that the connecting plate is stably connected with the top contact area of the chip through the multiple holes adsorbing and bonding materials.

The method for manufacturing the said dual-leadframe multi-chip package, characterized in that, the first chip is a high-side metal-oxide-semiconductor field effect transistor, the second chip is a low-side metal-oxide-semiconductor field effect transistor and the third chip is a bypass capacitor.

The method for manufacturing the said dual-leadframe multi-chip package, characterized in that, the first leadframe and the second leadframe form an integrated body.

Comparing with the existing art, a dual-leadframe multi-chip package and its manufacturing method for the present invention have the following advantages and favorable effects due to the adoption of the abovementioned technical solution:

1. The present invention simplifies manufacturing process through a connecting plate connects two chips and the pins of leadframes simultaneously.
2. The present invention decreases the resistance and inductance between chips, and shortens the distance between the chips since the connections between the chips and between the chips and the leadframe are realized via connecting plate.
3. The present invention minimizes parasitic inductance and improves the energy conversion efficiency of the whole device since a bypass capacitor is integrated in the package of chips.

4. The manufacturing of the dual-leadframe multi-chip package for the present invention boasts simple process, easy operation and low manufacturing cost.

BRIEF DESCRIPTION OF THE DRAWINGS

Refer to the drawings attached for further description of the embodiments of the present invention. However, the drawings are for explanation and clarification only and do not constitute the limit of the invention's scope.

DETAILED DESCRIPTION OF THE EMBODIMENTS

Figure 3:
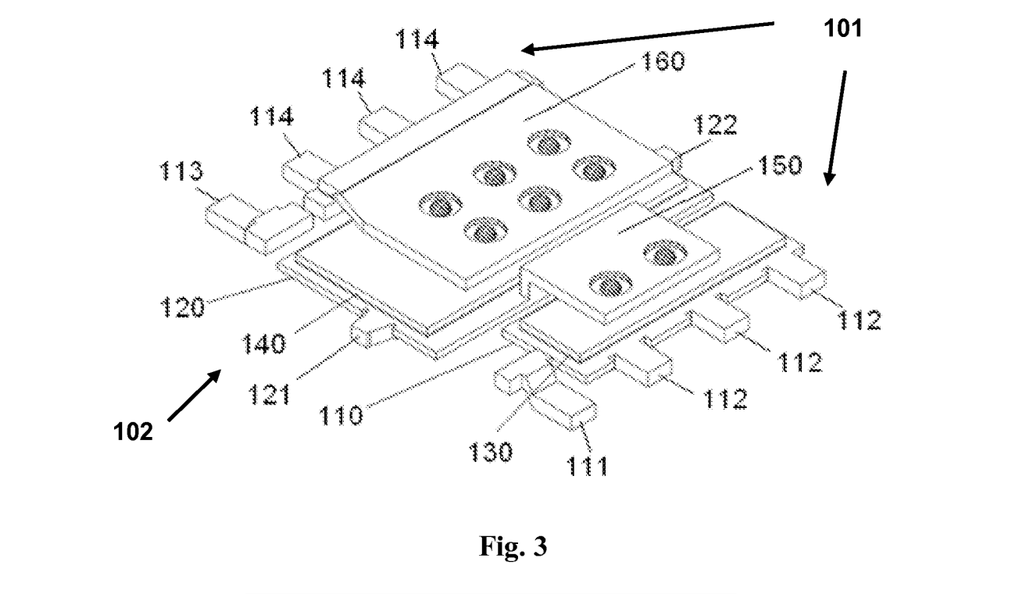
FIG. 3 is the schematic view of the structure of the dual-leadframe multi-chip package in Embodiment 1.

Embodiment 1: as shown in FIG. 3, a dual-leadframe multi-chip package, comprising two leadframes, two chips and two connecting plates. Two leadframes are a first leadframe 101 and a second leadframe 102, wherein the first leadframe 101 comprises a first die pad 110, multiple outer pins 111, 112, 113, 114 and multiple optional inner pins (not shown in the figure). The multiple outer pins are used for the connection with the internal chips correspondingly, and more or less pins may be adopted during real-life application; the second die pad 102 comprises a second die pad 120 and multiple optional inner pins (not shown in the figure) and multiple tie bars 121, 122. The tie bars 121, 122 are used for connection between leadframes and fastening leadframes. Multiple chips each has respectively a plurality of top contact areas (not shown in the figure) and a bottom contact area (not shown in the figure) including a first chip 130 and a second chip 140; the first chip 130 is mounted on the first die pad 110 through bonding materials, preferably, through conductive adhesive or soldering paste, and the second chip 140 is mounted on the second die pad 120 in the same manner through bonding materials; the bottom contact area of the first chip 130 is electrically connected with the first die pad 110, and the bottom contact area of the second chip 140 is electrically connected with the second die pad 120. Connecting plates are used for the connection in multi-chip package, wherein two connecting plates comprise a three-dimensional connecting plate 150 and a top connecting plate 160. The three-dimensional connecting plate 150 and the second die pad 120 form an integrated body preferably, or the three-dimensional connecting plate is electrically connected with the second die pad 120; and the three-dimensional connecting plate 150 connects a top contact area of the first chip 130 by the conductive bonding materials, thus the first chip 130 is electrically connected with the second die pad 120, and the second chip 140 is electrically connected with the second die pad, so the first chip 130 is electrically connected with the second chip 140 through the three-dimensional connecting plate 150 and the second die pad 120. The top connecting plate 160 connects a top contact area of the second chip 140 and the outer pin 114 of the first leadframe, preferably, the first chip 130 is a high-side metal-oxide-semiconductor field effect transistor, and the second chip 140 is a low-side metal-oxide-semiconductor field effect transistor. In this embodiment, the three-dimensional connecting plate 150 and the top connecting plate 160, on one hand, reduces the distance between the high-side metal-oxide-semiconductor field effect transistor and the low-side metal-oxide-semiconductor field effect transistor, on the other hand, decreases the inductance and resistance between chips, wherein the three-dimensional connecting plate 150 and the second die pad 120 are integrated to ensure a stable connection between them (150 and 120). The embodiment enumerates the package of two chips. In practical packaging, multiple chips can be set on the dual die pads. Through the connection of connecting plate with various chips, the dual-leadframe multi-chip packaging is realized and the manufacturing process becomes simple and convenient.

Figure 4:
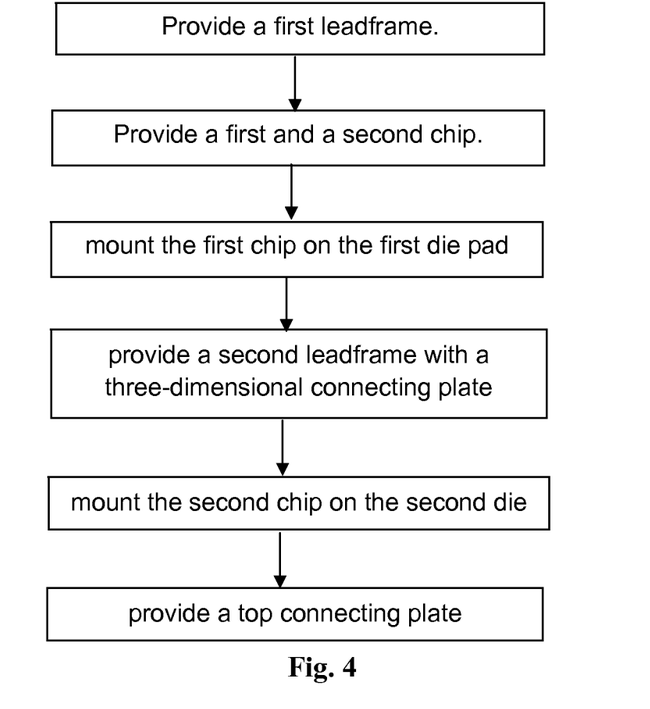
FIG. 4 is the flow chart of the method for the manufacturing dual-leadframe multi-chip package in Embodiment 1.

The manufacturing process of the dual-die pad multi-chip package, as shown in FIG. 4, comprising the following steps: first, provide a first leadframe 101, wherein the first leadframe 101 comprises the first die pad 110, multiple outer pins 111, 112, 113, 114, and multiple optional inner pins (not shown in the figure); and provide multiple chips, comprising the first chip 130 the second chip 140, preferably, the first chip 130 is a high-side metal-oxide-semiconductor field effect transistor, the second chip 140 is a low-side metal-oxide-semiconductor field effect transistor, wherein the first chip 130 and the second chip 140 each comprises a bottom contact area and a plurality of top contact areas respectively; second, the first chip 130 is mounted on the first die pad 110 through conductive bonding materials, the bottom contact area of the first chip 130 is electrically connected with the first die pad, and led out through the outer pin 112 of the first leadframe; after that, provide a second leadframe 102 and a three-dimensional connecting plate 150, wherein the second die pad 102 comprises the second die pad 120, multiple optional inner pins (not shown in the figure) and multiple tie bars 121, 122, preferably, the second die pad 120 and the three-dimensional connecting plate 150 form an integrated structure, or the three-dimensional connecting plate 150 is electrically connected with the second die pad 120, the three-dimensional connecting plate 150 connects the top contact area of the first chip 130 through conductive bonding material; afterwards, the second chip 140 is mounted on the second die pad 120 through conductive bonding materials, preferably, through conductive adhesive or soldering paste, the bottom contact area of the second chip 140 is electrically connected with the second die pad 120; in the end, provide a top connecting plate 160 connecting the top contact area of the second chip 140 and an outer pin 114 of the first leadframe 101 before encapsulation.

Figure 5:
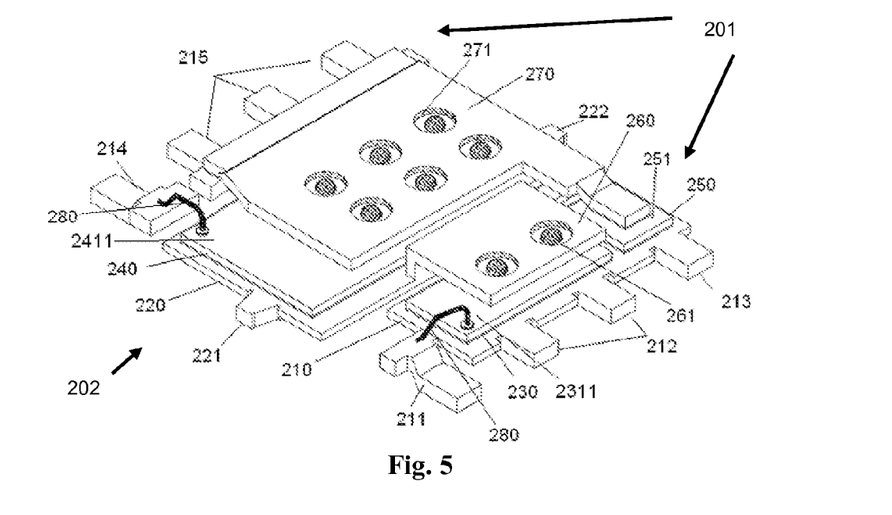
FIG. 5 is the schematic view of the structure of the dual-leadframe multi-chip package in Embodiment 2.
Figure 6:
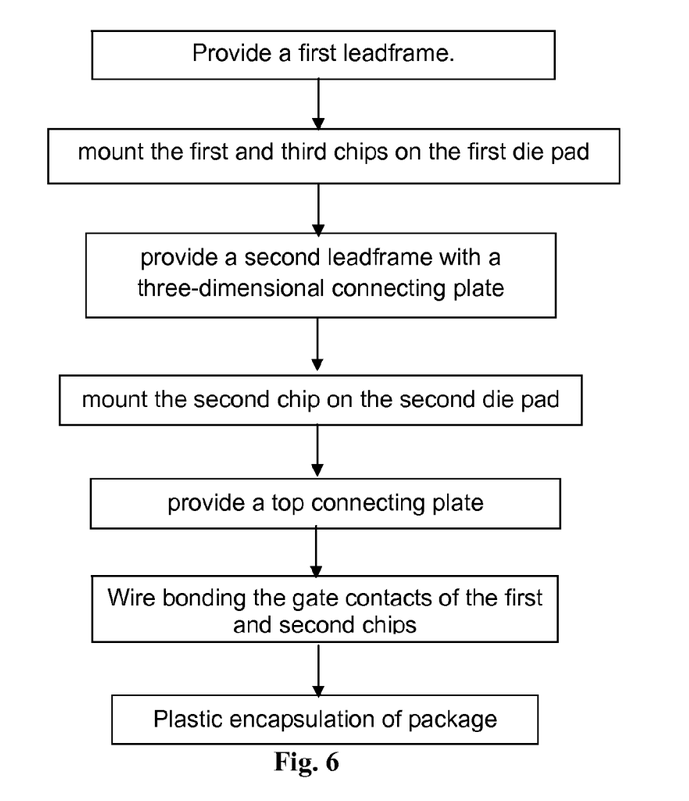
FIG. 6 is the flow chart of the method for manufacturing the dual-leadframe multi-chip package in Embodiment 2.

Embodiment 2: as shown in FIG. 5, a dual-leadframe multi-chip package, comprising two leadframes, three chips and two connecting plates. Two leadframes are the first leadframe 201 and the second leadframe 202, wherein the first leadframe 201 comprises a first die pad 210, multiple outer pins 211, 212, 213, 214, 215 and multiple optional inner pins (not shown in the figure), multiple outer pins are used for connection with internal chips correspondingly, and more or less pins can be adopted during real-life application; the second leadframe 202 comprises a second die pad 220, multiple optional inner pins (not shown in the figure) and multiple tie bars 221, 222 that are used for connection between leadframes and fastening leadframes. Multiple chips have respective top contact areas and bottom contact areas. The chips comprise the first chip 230, the second chip 240 and the third chip 250; the first chip 230 and the third chip 250 are mounted on the first die pad 210 through conductive bonding materials, and the second chip 240 is set on the second die pad 220 through conductive bonding materials, preferably soldering paste or conductive adhesive as conductive bonding materials. The bottom contact areas of the first chip 230 and the third chip 250 are electrically connected with the outer pins 212, 213 of the first die pad 210, the bottom contact area of the second chip 240 is electrically connected with the second die pad 220; the first chip 230 and the second chip 240 further comprises top gate contact areas 2311, 2411 different from the top contact areas, wherein the gate contact areas 2311, 2411 of the first chip 230 and the second chip 240 are respectively connected with the outer pins 211, 214 of the first die pad 210, preferably, the gate contact areas 2311, 2411 of the first chip 230 and the second chip 240 are connected with the outer pins 211, 214 of the first leadframe 201 respectively through the bond wires 280. Two connecting plates include a three-dimensional connecting plate 260 and a top connecting plate 270 respectively, wherein the three-dimensional connecting plate 260 and the top connecting plate 270 are provided with multiple holes 261, 271 on them, the multiple holes 261, 271 are used for adsorbing bonding materials so as to realize a stable connection between the connecting plates and the top contact areas of chips. Preferably, the three-dimensional connecting plate 260 and the second die pad 220 form an integrated body, or the three-dimensional connecting plate 260 is electrically connected with the second die pad 220. The three-dimensional connecting plate 260 connects the top contact area of the first chip 230 so that the top contact area of the first chip 230 is electrically connected with the second die pad 220; the top connecting plate 270 is used for connection in the multi-chip package, the top connecting plate 270 connects the top contact area of the second chip 220 and the outer pin 215 of the first die pad 210, and the top connecting plate 270 also connects the top contact area of the third chip 250. Preferably, the first chip 230 is a high-side metal-oxide-semiconductor field effect transistor, the second chip 240 is a low-side metal-oxide-semiconductor field effect transistor and the third chip 250 is a bypass capacitor for decreasing parasitic inductance. In this embodiment, the three-dimensional connecting plate 260 and the top connecting plate 270, on one hand, enable a shorter distance between the high-side metal-oxide-semiconductor field effect transistor and the low-side metal-oxide-semiconductor field effect transistor, on the other hand, reduce the inductance and resistance between the chips, whereby the three-dimensional connecting plate 260 is stably connected with the second die pad 220 due to the integrated structure of the three-dimensional connecting plate 260 and the second die pad 220. Moreover, the bypass capacitor reduces the parasitic inductance in circuit and improves the energy conversion efficiency of the whole device. The embodiment enumerates the package of two chips. In practical packaging, multiple chips can be mounted on the dual leadframes. Through the connection of connecting plates with various chips, the dual-leadframe multi-chip packaging is realized.

Figure 7:
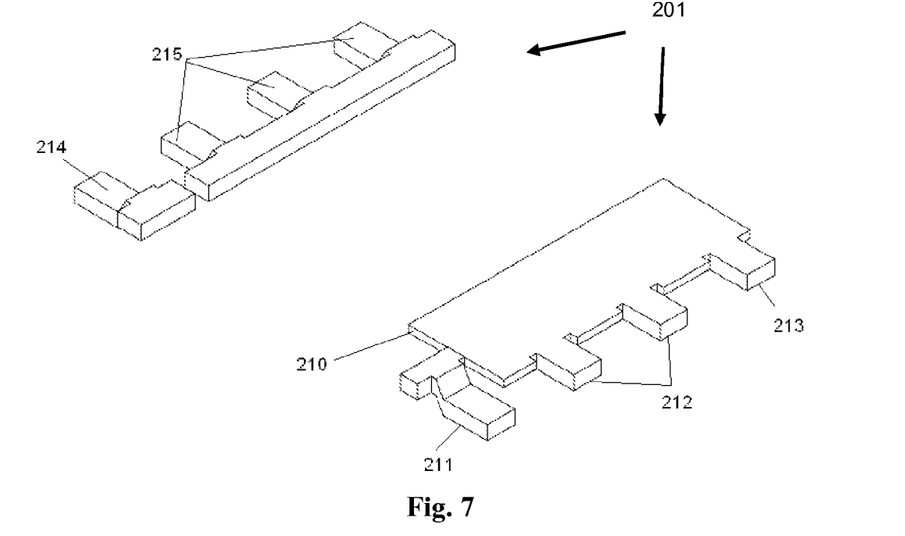
FIG. 7 is the schematic view of the structure of the first leadframe provided in the method for manufacturing the dual-leadframe multi-chip package in Embodiment 2.
Figure 8:
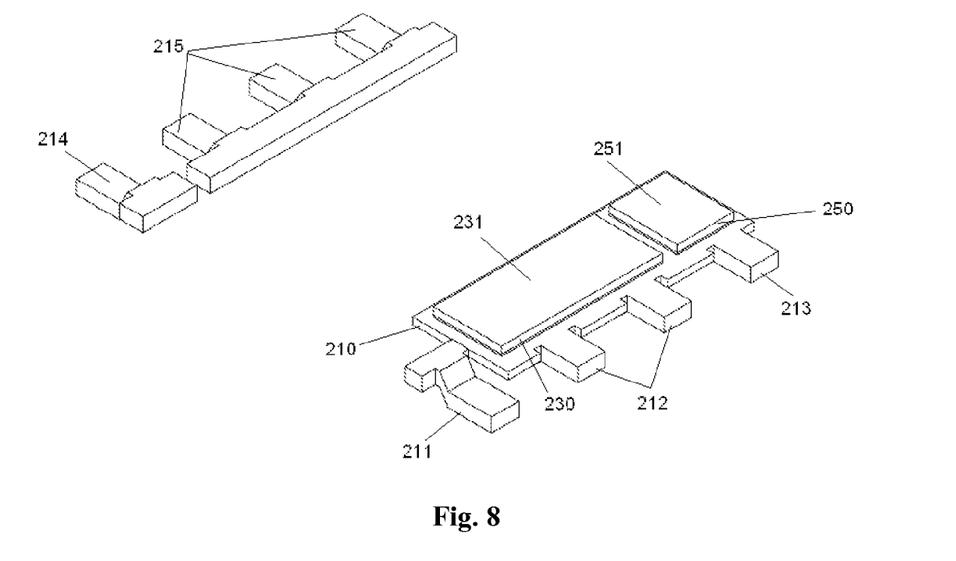
FIG. 8 is the schematic view of the structure that the first chip and the third chip are mounted on the first die pad provided in the method for manufacturing the dual-leadframe multi-chip package in Embodiment 2.
Figure 9:
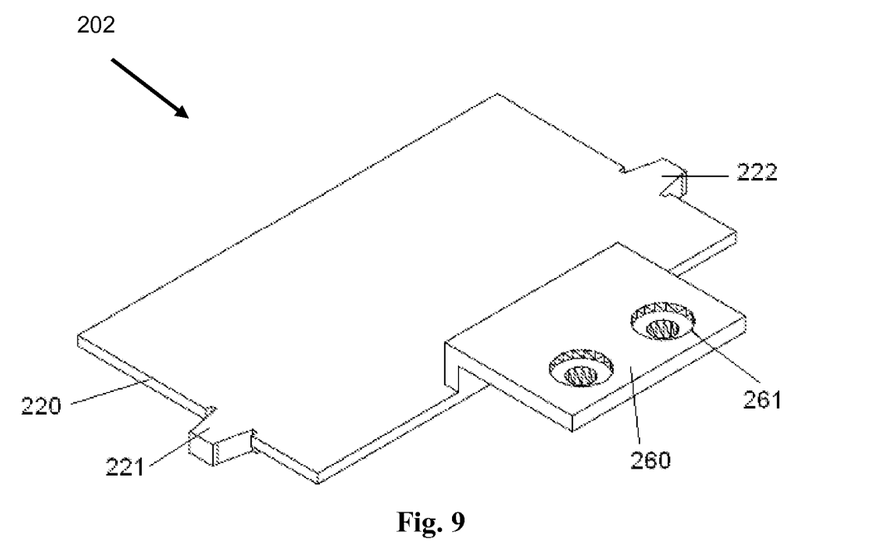
FIG. 9 is the schematic view of the structure that the integrated second die pad and three-dimensional connecting plate in the method for manufacturing the dual-leadframe multi-chip package in Embodiment 2.
Figure 10:
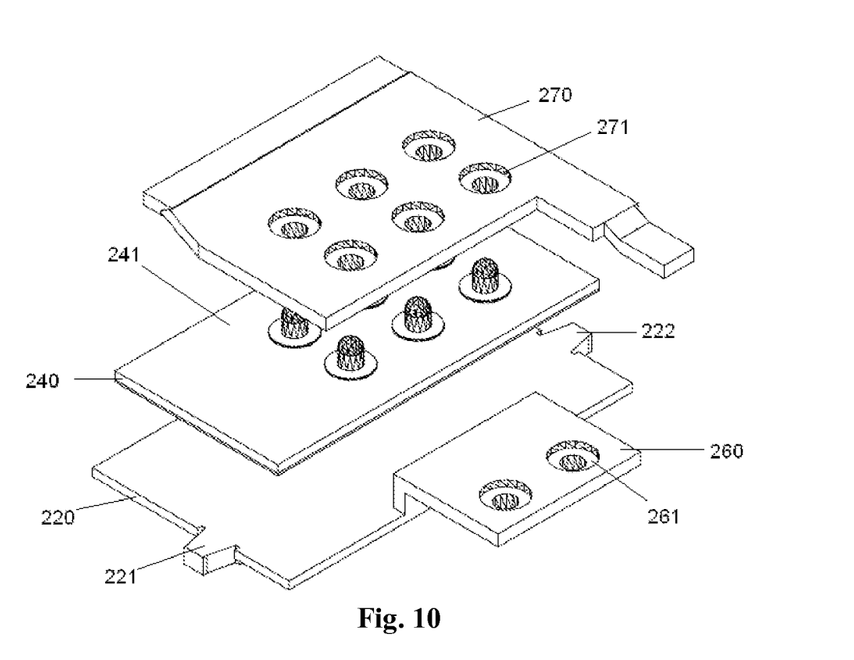
FIG. 10 is the schematic view of the structure of a second chip and top connecting plate in the method for manufacturing the dual-leadframe multi-chip package in Embodiment 2.

The manufacturing process of the dual-leadframe multi-chip package, as shown in FIG. 6-10, comprises the following steps. As shown in FIG. 7, first, provide a first leadframe 201 comprising the first die pad 210, multiple outer pins 211, 212, 213, 214, 215 and multiple optional inner pins (not shown in the figure); second, provide multiple chips, comprising the first chip 230, the second chip 240 and the third chip 250. Preferably, the first chip 230 is a high-side metal-oxide-semiconductor field effect transistor, the second chip 240 is a low-side metal-oxide-semiconductor field effect transistor and the third chip 250 is a bypass capacitor, wherein the first chip 230, the second chip 240 and the third chip 250 comprise the bottom contact areas (not shown in the figure) and the top contact areas 231, 241, 251 respectively, as shown in FIG. 8, the first chip 230 and the third chip 250 are mounted on the first die pad 210. Preferably, the first chip 230 and the third chip 250 are mounted on the first die pad 210 through adhesive such as conductive adhesive or soldering paste, and meanwhile the bottom contact areas of the first chip 230 and the third chip 250 are electrically connected with the outer pins 212, 213 of the first die pad 210; third, as shown in FIG. 9, provide a second leadframe 202 and a three-dimensional connecting plate 260. Preferably, the three-dimensional connecting plate 260 and the second die pad 220 form an integrated structure, or the three-dimensional connecting plate 260 is electrically connected with the second die pad 220, wherein the second die pad 220 comprises multiple tie bars 221, 222. The three-dimensional connecting plate 260 is provided with multiple holes 261 to adsorb adhesive at hole location. The three-dimensional connecting plate is connected with the top contact area 231 of the first chip 230 through adhesive, preferably, the three-dimensional connecting plate 260 is connected with the source contact area of the first chip 230 so that the top contact area of the first chip 230 is electrically connected with the second die pad 220. Afterwards, as shown in FIG. 10, the second chip 240 is mounted on the second die pad 220, and the second chip 240 is electrically connected with the second die pad 220. A top connecting plate 270 then provided with multiple holes 271 set on the top connecting plate 270 to adsorb adhesive at the hole 271 locations so as for connecting the top connecting plate 270 to the top contact area of the second chip, and the top connecting plate 270 connects the outer pin 215 of the first leadframe 201 and the top contact area 251 of the third chip 250. After that, reflow soldering bead to form solder bumps on the gate contact areas 2311, 2411 of the first chip and the second chip, and the gate contact areas 2311, 2411 of the first chip and the second chip are connected onto the pins 211, 214 of the first leadframe through the bond wires 280. In the end, clean the leadframes and apply plastic molding for encapsulating the die pads, the connecting plates and the chips, such that only part of outer pins of the leadframes are exposed.

Figure 11:
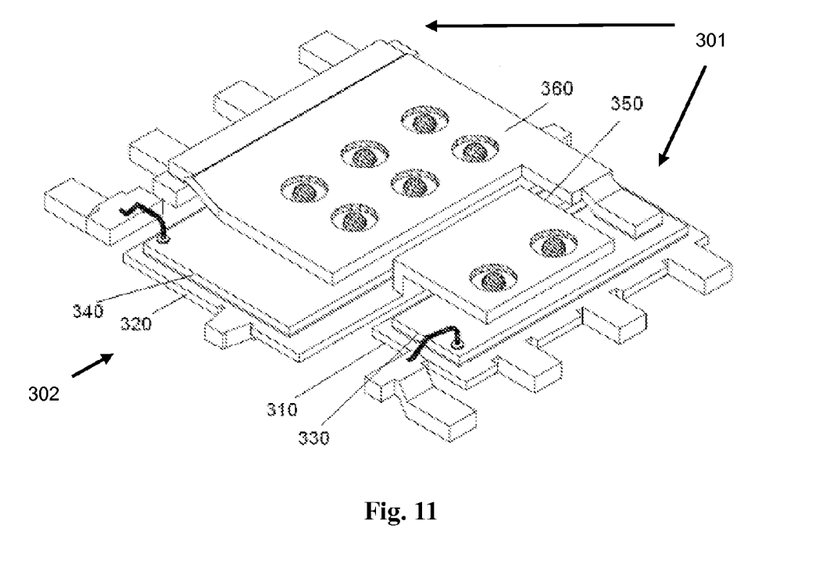
FIG. 11 is the schematic view of the structure of the dual-leadframe multi-chip package in Embodiment 3.

Embodiment 3: as shown in FIG. 11, a dual-leadframe multi-chip package, comprising two leadframes, two connecting plates and three chips, wherein the two leadframes are the first leadframe 301 and the second leadframe 302 respectively, the two connecting plates are the three-dimensional connecting plate 350 and the top connecting plate 360 respectively, three chips are respectively the first chip, the second chip 340 and the third chip, preferably, the first chip is a high-side metal-oxide-semiconductor field effect transistor, the second chip 340 is a low-side metal-oxide-semiconductor field effect transistor and the third chip is a bypass capacitor, as shown in FIG. 10, Embodiment 3 is basically the same as Embodiment 2, the difference is that, the high-side metal-oxide-semiconductor field effect transistor and the bypass capacitor firstly integrate forming a chip 330 mounted on the first die pad 310. The integration of the high-side metal-oxide-semiconductor field effect transistor and the bypass capacitor onto an integrated chip can reduce the parasitic inductance of chips, improve the energy conversion efficiency of the whole device and raise the integration level of chip packaging.

Figure 12:
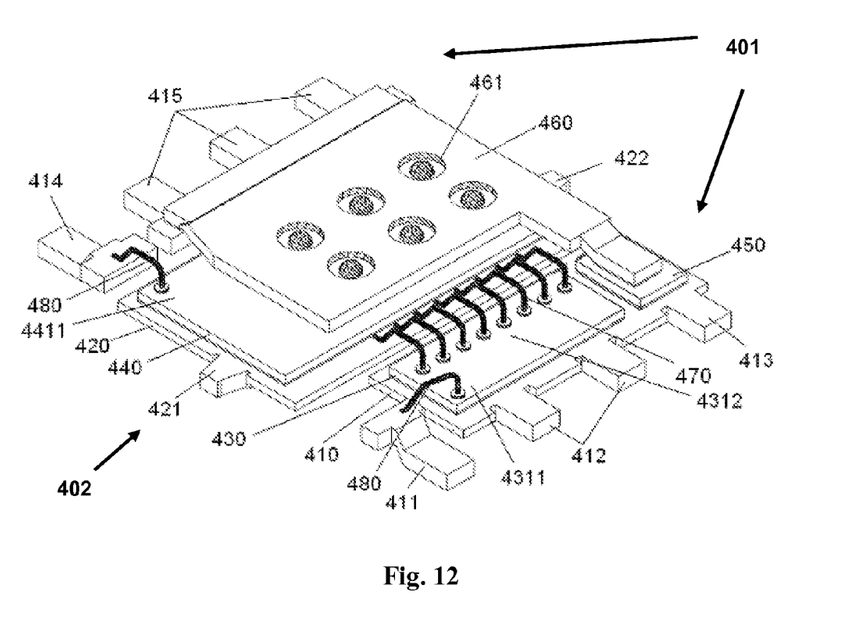
FIG. 12 is the schematic view of the structure of the dual-leadframe multi-chip package in Embodiment 4.

Embodiment 4: as shown in FIG. 12, a dual-leadframe multi-chip package, comprising two leadframes, three chips and a connecting plate. Two leadframes are respectively the first leadframe 401 and the second leadframe 402. Preferably, the first leadframe and the second leadframe are two parts of an integrated base plate, wherein the integrated base plate may comprise multiple parts, the first leadframe 401 comprises a first die pad 410, multiple outer pins 411, 412, 413, 414, 415 and multiple optional inner pins (not shown in the figure). The second leadframe 402 comprises a second die pad 420, multiple optional inner pins (not shown in the figure) and multiple tie bars 421, 422. The multiple chips each having a plurality of top contact areas and a bottom contact area respectively, comprise a first chip 430, a second chip 440 and a third chip 450. Preferably, the first chip 430 is a high-side metal-oxide-semiconductor field effect transistor, the second chip 440 is a low-side metal-oxide-semiconductor field effect transistor and the third chip 450 is a bypass capacitor. The first chip 430 and the third chip 450 are mounted on the first die pad 410 through conductive bonding materials, the second chip 440 is mounted on the second die pad 420 through conductive bonding materials, the bottom contact areas of the first chip 430 and the third chip 450 are electrically connected with the first die pad 410, the bottom contact area of the second chip 440 is electrically connected with the second die pad 420, the first chip 430 and the second chip 440 further comprise gate contact areas 4311, 4411, the gate contact areas 4311, 4411 of the first chip 430 and the second chip 440 are further electrically connected with the outer pins 411, 414 of the first leadframe 401. Preferably, the gate contact areas 4311, 4411 of the first chip 430 and the second chip 440 are connected with the outer pins 411, 414 of the first leadframe 401 through bond wires 480 respectively. A top connecting plate 460 is provided with multiple holes 461 for adsorbing bonding materials so as to better connect the top connecting plate 460 to the top contact areas. The top connecting plate 460 connects the top contact area of the second chip 440 and the outer pin 415 of the first leadframe 401. The plate 460 further connects the top contact area of the third chip 450. The top contact area 4312 of the first chip 430 is electrically connected with the second die pad 440 through bond wires 470 so that the first chip 430 is electrically connected with the second chip 420. In this embodiment, the top connecting plate 460 is used for connection between chips and between chips and the leadframes, thus to reduce the inductance between the chips, improve the stability of connection. The connection between the chips by means of bond wires provides the flexibility of chip connection.

Figure 13:
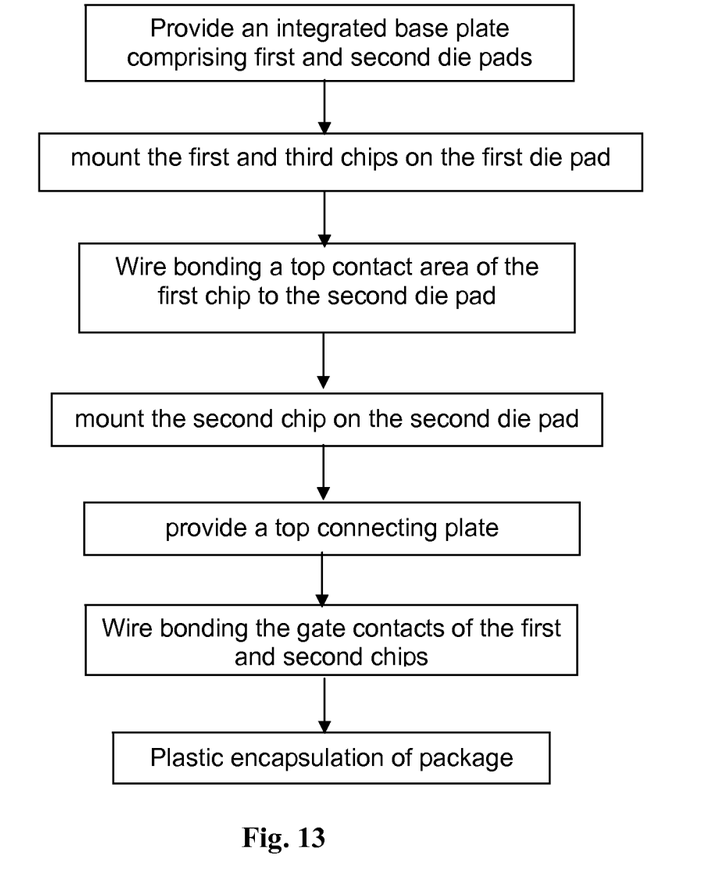
FIG. 13 is the flow chart of the method for the manufacturing dual-leadframe multi-chip package in Embodiment 4.

The manufacturing process of the dual-die pad multi-chip package, comprising the following steps, firstly, provide an integrated base plate, wherein the integrated base plate comprises the first die pad 410 and the second die pad 420 constituting an integrated leadframe of first leadframe 401 and second leadframe 402. The first leadframe 401 further comprises multiple outer pin 411, 412, 413, 414, 415 and multiple optional inner pins (not shown in the figure), the second leadframe 402 further comprises multiple tie bars 421, 422.; afterwards, provide multiple chips, comprising the first chip 430, the second chip 440 and the third chip 450. Preferably, the first chip 430 is a high-side metal-oxide-semiconductor field effect transistor, the second chip 440 is a low-side metal-oxide-semiconductor field effect transistor and the third chip 450 is a bypass capacitor. The first chip 430 and the third chip 450 are mounted on the first die pad 410. preferably through adhesives such as conductive adhesive or soldering paste, and the bottom contact areas of the first chip 430 and the third chip 450 are electrically connected with the first die pad; secondarily, the top contact area of the first chip 430 is connected with the second die pad through bond wires 470. Afterwards, the second chip 440 is mounted on the second die pad with its bottom contact area electrically connected with the second die pad 420; and then provide a top connecting plate 460, wherein multiple holes 461 are set on the top connecting plate 460 for adsorbing bonding materials, the top connecting plate 460 is connected with a top contact area of the second chip 440 so that the top connecting plate 460 connects the top contact area of the second chip 440 and the outer pin 415 of the first leadframe 401, and the top connecting plate 460 also connects a top contact area of the third chip 450; afterwards, the gate contact areas 4311, 4411 of the first chip 430 and the second chip 440 are connected with the pins 411, 414 of the first leadframe through the bond wires 480; in the end, clean the leadframes and package the die pads, the connecting plates and the chips by means of plastic package such that only part of the outer pins of the leadframes are exposed.

It is necessary to recognize that the description above is the explanation of the preferred embodiments and the present invention is subject to modification without deviating from the spirit and scope claimed by the claims attached.

The present invention is not limited to the abovementioned description or details and methods displayed by the drawings. Other embodiments may be also applicable for the present invention and multiple modes can be adopted. Moreover, we must be aware that the wording and terminology as well as expression are for introducing the invention only, and shall never be limited herein.

For this reason, it will be understood by a person skilled in this art, the concept on which the present invention is based can be applied to design other structures, methods and systems for implementing several targets of the present invention. Therefore, it is very important that the claims are considered to include all equivalent conformations as long as they are within the spirit and scope of the present invention.

The invention claimed is:

1. A method for manufacturing a dual-leadframe multi-chip package, comprises the following steps:

Step 1: provide a first leadframe comprising a first die pad and multiple outer pins;

Step 2: provide a first chip and a second chip, wherein the first chip and the second chip each comprising a bottom contact area and a plurality of top contact areas respectively;

Step 3: mount the first chip on the first die pad, the bottom contact area of the first chip be electrically connected with the first die pad;

Step 4: provide a second leadframe with a second die pad and a three-dimensional connecting plate, electrically connect the three-dimensional connecting plate to a top contact area of the first chip, wherein the second die pad and the three-dimensional connecting plate forming an integrated body;

Step 5: mount the second chip on the second die pad with the bottom contact area of the second chip is electrically connected to the second die pad; and Step 6: provide a top connecting plate connecting a top contact area of the second chip to an outer pin of the first leadframe.

2. The method for manufacturing a dual-leadframe multi-chip package of claim 1, further comprising electrically connect the top connecting plate to a second top contact area of the first chip different from the first top contact area of the first chip in Step 6.

3. A method for manufacturing a dual-leadframe multi-chip package, comprises the following steps:

Step 1: provide a first leadframe comprising a first die pad and multiple outer pins;

Step 2: mount a first chip on the first die pad with a bottom contact area of the first chip electrically connected to the first die pad, mount a third chip on the first die pad with a bottom contact area of the third chip electrically connected to the first die pad;

Step 3: provide a second leadframe having a second die pad, electrically connect a top contact area of the first chip to the second die pad;

Step 4: mount a second chip on the second die pad with a bottom contact area of the second chip electrically connected to the second die pad;

Step 5: provide a top connecting plate for electrically connecting a top contact area of the second chip and a top contact area of the third chip to an outer pin of the first leadframe;

Step 6: electrically connect a top gate contact area of the first chip to an outer pin of the first leadframe, electrically connect a top gate contact area of the second chip to an outer pin of the first leadframe;

Step 7: clean the first and second leadframes, apply plastic package to encapsulate the first and second die pads, the top connecting plate and the chips such that only part of outer pins of the leadframes exposed.

4. The method for manufacturing a dual-leadframe multi-chip package of claim 3, further comprising provide a three-dimensional connecting plate formed as an integrated structure of the second die pad in Step 3 for electrically connecting the top contact area of the first chip to the second die pad.

5. The method for manufacturing a dual-leadframe multi-chip package of claim 4 wherein the first chip is a high-side metal-oxide-semiconductor field effect transistor, the second chip is a low-side metal-oxide-semiconductor field effect transistor and the third chip is a bypass capacitor.

6. The method for manufacturing a dual-leadframe multi-chip package of claim 3 further comprising, provide a plurality of bond wires in Step 3 for electrically connecting the top contact area of the first chip to the second die pad.

7. The method for manufacturing a dual-leadframe multi-chip package of claim 6 wherein the step of providing a first leadframe in Step 1 and the step of providing a second leadframe in Step 3 comprising a step of providing an integrated leadframe comprising a first die pad and a second die pad.

8. The method for manufacturing a dual-leadframe multi-chip package of claim 3 further comprising, integrate the third chip into the first chip before mounting on the first die pad in Step 2.

9. The method for manufacturing a dual-leadframe multi-chip package of claim 8 wherein the first chip is a high-side metal-oxide-semiconductor field effect transistor with an integrated bypass capacitor and the second chip is a low-side metal-oxide-semiconductor field effect transistor.

\* \* \* \* \*